United States Patent [19]

Smith

[11] 3,806,741

[45] Apr. 23, 1974

[54] SELF-BIASING TECHNIQUE FOR MOS SUBSTRATE VOLTAGE

[75] Inventor: Frederick J. Smith, Centereach, N.Y.

[73] Assignee: Standard Microsystems Corp., Hauppauge, Long Island, N.Y.

[22] Filed: May 17, 1972

[21] Appl. No.: 254,058

[52] U.S. Cl. .................................. 307/304, 307/235
[51] Int. Cl. ................................................ H03k 3/26
[58] Field of Search ........... 307/304, 251, 279, 205, 307/221, 235

[56] References Cited

UNITED STATES PATENTS

| | | | |
|---|---|---|---|
| 3,604,952 | 9/1971 | Regitz | 307/279 |
| 3,638,047 | 1/1972 | Klein | 307/304 |
| 3,643,253 | 2/1972 | Blank | 307/304 |
| 3,673,438 | 6/1972 | Lund | 307/304 |
| 3,577,166 | 5/1971 | Yung | 307/279 |

*Primary Examiner*—Rudolph V. Rolinec
*Assistant Examiner*—Ro E. Hart
*Attorney, Agent, or Firm*—Sandoe, Hopgood & Calimafde

[57] ABSTRACT

A circuit that senses and corrects the value of the threshold voltage of an MOS integrated circuit is disclosed in which an error signal corresponding to the deviation of the threshold voltage from a desired level is developed. That signal controls the magnitude of a bias voltage that is applied to the substrate, to thereby vary the threshold voltage according to the source body effect. The thus varied substrate voltage adjusts the level of the effective threshold voltage to the desired level.

10 Claims, 5 Drawing Figures

SELF-BIASING TECHNIQUE FOR MOS SUBSTRATE VOLTAGE

The present invention relates generally to MOS circuits, and more particularly to an MOS integrated circuit including means for establishing and maintaining a desired threshold voltage for that circuit.

In the design and fabrication of MOS circuits and devices (e.g., field-effect transistors), one parameter that is generally regarded as significant if not critical to satisfactory circuit performance is the threshold voltage. In a field-effect transistor (FET), the threshold voltage is the minimum voltage which, when applied to the gate electrode, produces channel inversion and conduction between the source and drain regions. If the threshold voltage is below a specified or nominal level, the device is unstable in operation, as it may be improperly rendered conductive by a noise signal, and is thus particularly unsuitable for use in logic circuits. If the threshold voltage is greater than the desired level, the speed of the operation of the FET is reduced, and the FET may fail to be turned on when an input signal is applied to the gate electrode.

The value of the threshold voltage is determined primarily by the thickness and electrical characteristics of the silicon dioxide gate insulation film which underlies the gate electrode and overlies the channel between the source and drain regions. Despite recent improvements in the processes for fabricating MOS devices and circuits, precise control of the gate insulation film thickness and dielectric constant is not as yet achievable in an economical manner to the extent desired for an accurate determination of the threshold voltage. As a result, the threshold voltage of a typical n-channel device produced by conventional MOS fabrication techniques is 0.3 ± .2 volts. It has been found that the threshold voltage of n-channel devices is usually below rather than above the nominal or desired threshold voltage level.

The effective value of the threshold voltage is also related to the source-to-substrate voltage in accordance with the source-body effect. The effective threshold voltage of an MOS device may be expressed as $$V_{T(eff)} = V_{T(nom)} + \Delta V_T$$

where $V_{T(eff)}$ is the effective value of the threshold voltage, $V_{T(nom)}$ is the nominal value of the threshold voltage as determined by the gate insulating film thickness, and $\Delta V_T$ is the incremental threshold voltage that corresponds to the substrate voltage according to the source-body effect.

In the design of MOS integrated circuits, it is generally desirable to connect the substrate to a fixed voltage so that the substrate does not "float." It is thus common for MOS designers to connect the substrate to the $V_{SS}$ connection or source power supply line. By definition, this eliminates the source-body effect for those devices having their sources connected to the $V_{SS}$ supply. For these devices the threshold voltage is controlled solely by the initial processing of the gate insulation film, and is therefore difficult to control accurately. Moreover, this approach cannot be employed in those circuit applications which require an effective threshold voltage greater than the actual threshold voltage determined by the process parameters.

One technique that has been employed by MOS designers to control the effective threshold voltage is to connect the substrate to a separate external power supply. This provides a wider choice for the effective threshold voltage since the source-body effect can be utilized to extend the range by the careful selection of the power supply voltage. However, the variation in the effective threshold voltage is further degraded because the source-body voltage is also subject to process variations. As a result, many MOS circuits in which the effective threshold voltages, even when modified by the external power supply, still fall outside a specified range of threshold voltages must be discarded resulting in increeased fabrication costs which are inevitably passed on to the end user of the MOS circuits. This technique has the further disadvantage of requiring the use of an extra package lead as well as an additional power supply voltage.

Greater control of the effective threshold voltage can be achieved by establishing increased control over the MOS circuit fabrication process, to thereby achieve greater uniformity and precision in the gate insulation film thickness. This increased control can, however, only be achieved by measures that add significantly to the fabrication costs of MOS circuits, and are generally prohibitive from an economic viewpoint.

It is an object of the invention to provide a technique for achieving increased control of the effective threshold voltage of an MOS integrated circuit.

It is a further object of the invention to provide a technique of the type described which employs the source-body effect to establish a desired effective threshold voltage.

It is another object of the invention to provide in an MOS integrated circuit, a technique for establishing and controlling the substrate voltage to achieve an accurate determination of the threshold voltage without connecting the substrate to an external power source.

It is yet a further object of the invention to provide a technique for increasing the yield of satisfactory MOS integrated circuits in which the value of the threshold voltage is within desired limits in a reliable manner, and in which the additional costs of MOS circuit fabrication are relatively insignificant.

In the circuit of the invention, the threshold voltage is sensed by a transducer. The latter produces an error signal that is proportional to the level of the threshold voltage. The error signal is applie to an oscillator to control a parameter (e.g., amplitude or frequency) of the oscillator output signal, and the output signal is in turn applied to a bias signal generator which provides a charging signal to the substrate.

The voltage to which the substrate is charged in this manner modifies the threshold voltage of the circuit to a desired level in accordance with the source-body effect. Once the desired threshold level is achieved, the output of the threshold voltage transducer is at a value that maintains the substrate voltage and thus the effective threshold voltage at desired levels. The circuit of the invention can thus be considered as a feedback loop by means of which sufficient variation is made and thereafter maintained to the nominal threshold voltage under the control of a self-biased voltage established at the substrate.

To the accomplishment of the above and to such further objects as may hereinafter appear, the present invention relates to an MOS threshold voltage sensing and control circuit, substantially as defined in the appended claims and as described in the following specification, taken together with the accompanying drawings, in which:

The circuit of the invention comprises means for sensing the nominal threshold voltage of an MOS circuit, that is, the threshold voltage initially established during the fabrication of the MOS circuit, and for producing an error signal corresponding to the difference between the sensed threshold voltage and a desired threshold voltage. The error signal is thereafter employed to establish a voltage level at the substrate which is effective, according to the source-body effect, to vary the effective threshold voltage to the desired level for optimum circuit operation.

Figure 1:
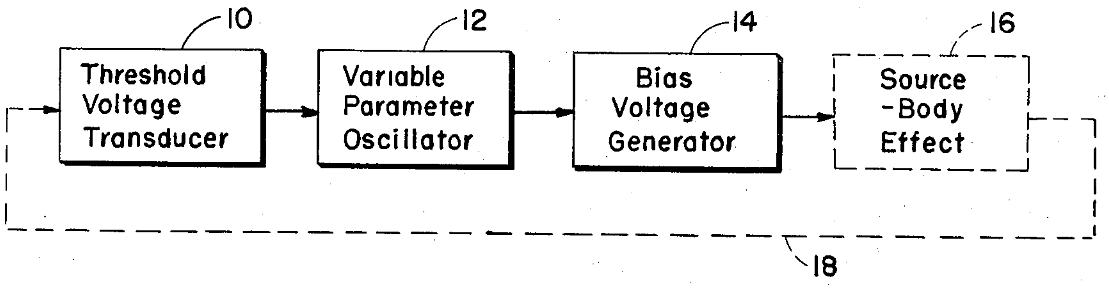
FIG. 1 is a block diagram of the threshold voltage sensing and control circuit of the invention.

As shown diagramatically in FIG. 1, the circuit of the invention is a closed-loop that self-biases the substrate to achieve the desired threshold voltage. That loop includes a threshold voltage transducer 10 for producing an error signal that is representative of the difference between the actual threshold voltage and a desired or optimum value of the threshold voltage.

The error signal developed by transducer 10 is applied to a variable parameter oscillator 12 which produces at its output a repeating signal having a parameter (e.g., voltage or frequency) that is proportional to a parameter, here amplitude, of the error signal. The output of oscillator 12 is applied to a bias voltage generator 14 which develops a biasing voltage that is applied to charge or self-bias the substrate (not shown).

Figure 4:
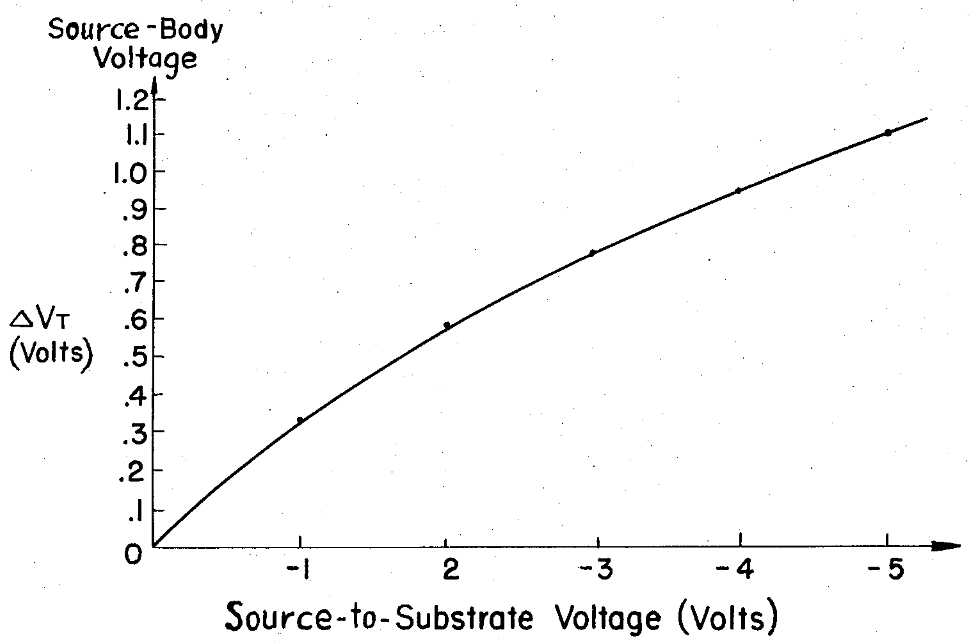
FIG. 4 is a graphical representation of the source-body effect.

The voltage established at the substrate in this manner modifies the effective threshold voltage of the MOS circuit in accordance with the source-body effect indicated by the broken-line block in FIG. 1. The source-body effect is described in FIG. 4, which graphically describes the relationship between the change in the threshold voltage $\Delta V_T$ as a function of the substrate voltage, for a typical fabrication process.

That is, as a different bias voltage is established at the substrate in response to the error signal developed by transducer 10, a corresponding variation $\Delta V_T$ is introduced to the threshold voltage, as indicated by the broken line connection 18 between the source-body block 16 and transducer 10. As a result of the feedback loop operation, the substrate is charged to a level that establishes a desired effective threshold voltage equal to the initial or nominal threshold voltage level as modified by the source-body threshold voltage variation $\Delta V_T$. The thus established threshold voltage and substrate bias voltage are thereafter maintained as desired for optimum MOS circuit operation.

Figure 2:
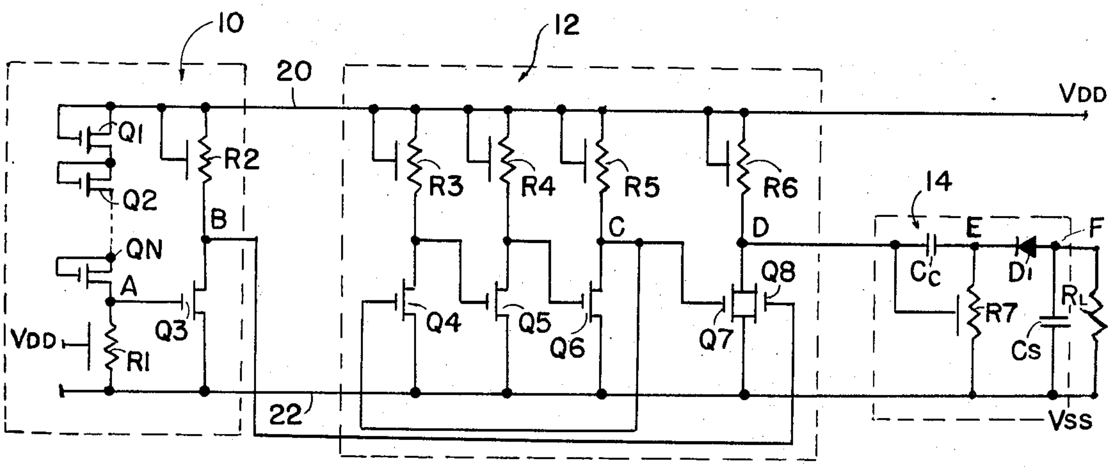
FIG. 2 is a detailed schematic diagram of the circuit of FIG. 1.

In FIG. 2 there is shown a practical circuit embodying the basic elements of FIG. 1. Elements in FIG. 2 that correspond to the blocks of FIG. 1 are identified by reference numerals that are employed in FIG. 1. That is, as shown in FIG. 2, threshold voltage transducer 10 includes a plurality of series-connected field effect transistors (FETs) Q1, Q2...Q$n$. The source and drain circuits of FETs Q1 – Q$n$ are connected in series between a $V_{DD}$ supply line 20 and a node A. The gates of these FETs are respectively connected to their drains, and an MOS resistive device $R_1$ is connected between node A and a $V_{SS}$ supply line 22. The gate of device $R_1$ is connected to the $V_{DD}$ supply at line 20.

Node A is connected to the gate of an amplifying-inverting FET Q3 which has a source connected to $V_{SS}$ at line 22, and a drain connected through an MOS resistive device $R_2$ to the $V_{DD}$ line 20, a node B being defined between FET Q3 and device $R_2$. The gate of device $R_2$ is connected to line 20.

In operation, to a first approximation each of FETs Q1 – Q$n$ experiences a single threshold voltage drop between its source and drain, such that the voltage at node A is equal to $V_{DD} - n \cdot V_T$ where $V_T$ is the threshold voltage and $n$ is the number of series-connected FETs in transducer 10. The error voltage developed in this manner at node A is thus proportional to the circuit threshold voltage and corresponds to the difference between the actual threshold voltage and the desired threshold voltage. The error voltage at node A is amplified and inverted by a FET Q3 and appears in an amplified and inverted form at node B.

Variable oscillator 12 comprises, in the embodiment of the invention herein described, FETs Q4, Q5 and Q6 which have their sources coupled to $V_{SS}$ line 22 and their drains respectively coupled to one terminal of MOS resistive devices R3, R4 and R5. The other terminals of devices R3, R4 and R5 as well as the gates of these devices are all coupled to line 20.

The drain of FET Q6 is coupled at a node C in a feedback manner to the gate of FET Q4. The drains of FETs Q4 and Q5 are respectively coupled to the gates of FETs Q5 and Q6. Oscillator 12, as described, is known to those skilled in the art and its arrangement and manner of operation are accordingly not further described herein.

Node C at the output of the oscillator proper is coupled to the gate of an FET Q7 which together with FET Q8 constitutes a control circuit for the oscillator. As shown, the drains of FETs Q7 and Q8 are coupled to a node D and to one terminal of a resistive device R6, the other terminal of which, along with its gate, are coupled to the $V_{DD}$ line. Similarly, the sources of FETs Q7 and Q8 are coupled together and to the $V_{SS}$ line 22, and the gate of FET Q8 is coupled to node B at the output of transducer 10.

Node D at the output of oscillator 12 is coupled to bias voltage generator 14, which, as shown in FIG. 2, consists of an MOS capacitor $C_c$ which, along with the gate of an MOS resistive device R7, is coupled to node D. Capacitor $C_c$ and one terminal of device R7 are coupled to a node E. The other terminal of device R7 is coupled to $V_{SS}$ line 22. Node E is also coupled to the cathode of an MOS diode D of which the anode is coupled to a capacitor $C_S$ to the $V_{SS}$ line, and to a node F on the substrate of the MOS circuit. A leakage resistor $R_L$ may be present between node F and the $v_{SS}$ line 22, as shown in FIG. 2.

In operation, an error voltage is developed at node A which corresponds to the threshold voltage of the MOS circuit for the reasons states above, and is thus proportional to the deviation between the actual or nominal and desired threshold voltages. That error voltage is amplified and inverted by FET Q3 and appears in its amplified and inverted form at node B.

Oscillator 14 produces a pulse train at a frequency determined by the oscillator parameters in a known manner. That pulse train appears at node C and is applied to the gate of FET Q7. The amplified error voltage is applied to the gate of FET Q8 where it is effective to control the extent of conduction of that transistor to in turn control the amplitude of the oscillator output signal developed at node D. For example, if the error voltage at node B is of an amplitude that turns FET Q8 fully on, then node D approaches the level of $V_{SS}$; if the voltage at node B causes FET Q8 to be fully turned off or non-conductive, then FET Q7, having a gate coupled to node C, inverts the signal at node C and presents the inverted oscillator signal at node D. For an intermediate level of conduction of FET Q8 in response to the magnitude of the error voltage at node B, the control circuit of FETs Q7 and Q8 modifies the oscillator output signal at node C by a corresponding degree between the two limits of conduction of FET Q8.

Figure 3:
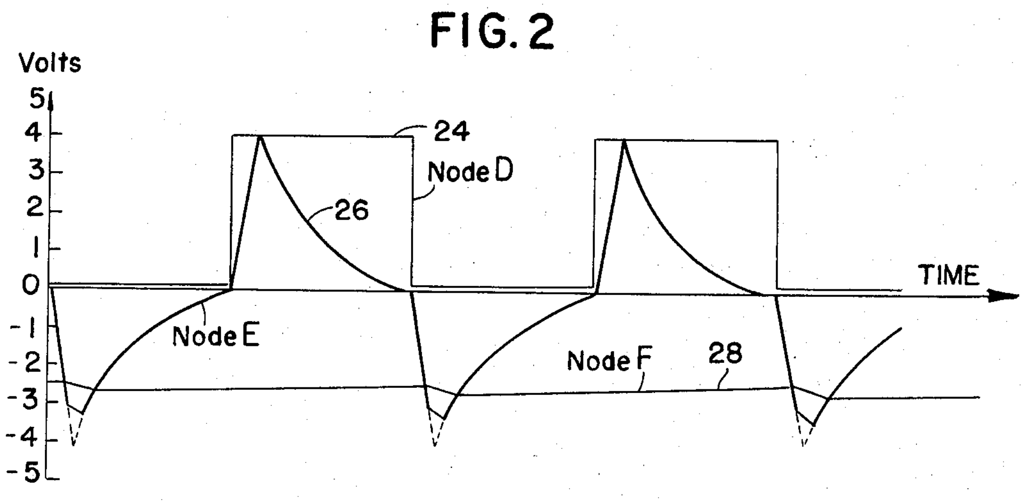
FIG. 3 is a diagram illustrating the signal waveforms at various points or nodes in the circuit of FIG. 2.

As a result of the operation of the control circuit, a waveform 24 is produced at node D (FIG. 3) which as shown is in the form of a pulse train having the frequency of the oscillator output signal and an amplitude which is inversely proportional to the degree of conductivity of FET Q8, and thus to the error voltages at nodes B and D, and ultimately to the value of the threshold voltage. The waveform at node D is differentiated by a differentiating circuit consisting of capacitance $C_C$ and the resistance device R7 to produce a signal at node E having a waveform 26 (FIG. 3). Diode D passes only the negative portions of the differentiated signal to substrate node F to establish a voltage at that node as illustrated by waveform 28.

The bias voltage established in this manner at node F is effective, in accordance with the source-body effect as described above, to modify the circuit threshold voltage and thereby modify the error voltages at nodes A and B. The modification of the voltage at node B in turn varies the amplitude of the oscillator output signal waveform 24 at node D. By a proper selection of the devices in transducer 10, oscillator 12, and bias voltage generator 14, the bias voltage that is finally established at node F is effective to establish the resultant circuit threshold voltage at the desired value. When the desired threshold voltage is thus achieved, the feedback loop including the transducer, oscillator, bias-voltage generator, and source-body effect link maintains the substrate node voltage and the threshold voltage at appropriate levels. That is, if the threshold voltage tends to deviate from its established desired value that deviation produces a corresponding variation in the substrate bias voltage, wich in turn modifies and restores the threshold voltage to the desired level.

Figure 5:
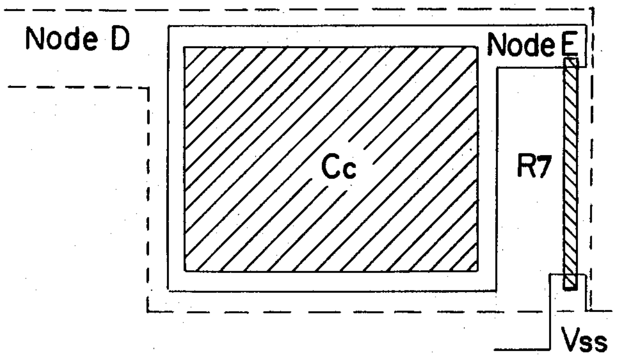
FIG. 5 is a plan view, on an enlarged scale, of the portion of the bias voltage generator of the circuit of FIG. 2.

FIG. 5 illustrates a portion of the layout of the MOS circuit in which the self-biasing threshold voltage control circuit of the invention is incorporated. The portion shown constitutes the components of the bias voltage generator and particularly the differentiating circuit of capacitor $C_C$ and resistor device R7. Also shown in FIG. 5 are the location of nodes D and E and a portion of the $V_{SS}$ line interconnect. The diode D and capacitor $C_S$ are elements that are inherently formed in the circuit at the interface of the substrate and the source (or drain) regions, and thus need not be separately formed in the MOS circuit.

The self-biasing and threshold voltage control circuit of this invention thus readily achieves all the objects previously set forth in that it enables the correction of the threshold voltage to a desired level for optimum circuit operation, and thereafter maintains accurate control of the threshold voltage at that desired level. This is all achieved in the circuit of the invention without the need for connecting the substrate to an external biasing source as has heretofore been proposed. In addition, biasing and threshold voltage control circuit of this invention can be readily implemented on an MOS circuit at little additional cost of fabrication.

While the invention has been herein specifically described with respect to a presently preferred embodiment thereof, it will be understood that variations may be made therein, all without departing from the spirit and scope of the invention.

What is claimed is:

1. A self-biasing circuit for controlling the threshold voltage of an MOS device including a substrate, said circuit comprising means for sensing the threshold voltage level of said MOS device and for producing an error signal corresponding to the threshold voltage level, means coupled to said threshold voltage level sensing means for developing a bias signal having an amplitude corresponding to the level of said error signal, and means for operatively applying said bias signal to said substrate, to thereby vary the threshold voltage level by an amount bearing a predetermined relation to the amplitude of said bias signal, in accordance with the source-body effect.

2. The self-biasing circuit of claim 1, in which said bias signal developing means comprises an oscillator, and means coupled to said oscillator and said sensing means for controlling a selected parameter of the output signal of said oscillator in accordance with the amplitude of said error signal.

3. The self-biasing circuit of claim 2, in which said parameter is amplitude, and said parameter controlling means comprises amplitude-controlling means including a control terminal coupled to said sensing means.

4. The self-biasing circuit of claim 3, in which said bias signal developing means further comprises signal differentiating means coupled between said amplitude-controlling means and said substrate.

5. The circuit of claim 4, in which said threshold voltage sensing means comprises a plurality of series-connected MOS devices connected between first and second reference voltage lines, an error node at which said error signal is produced being established at a point intermediate said first and second voltage lines, each of said devices experiencing a voltage drop that is substantially a measure of the circuit threshold voltage, such that said error voltage established at said error node is equal to a reference voltage less the number of threshold voltage drops occurring in the MOS devices intermediate one of said reference voltage lines and said error node.

6. The self-biasing circuit of claim 5, in which said amplitude controlling circuit comprises first and second MOS devices connected in parallel, the gates of one of said devices being coupled to the output of said oscillator, and the gate of the other of said MOS devices defining said control terminal and being coupled to said error node.

7. The circuit of claim 1, in which said threshold voltage sensing means comprises a plurality of series-connected MOS devices connected between first and second reference voltage lines, an error node at which said error signal is produced being established at a point intermediate said first and second voltage lines, each of said devices experiencing a voltage drop that is substantially a measure of the circuit threshold voltage, such that said error voltage established at said error node is equal to a reference voltage less the number of threshold voltage drops occurring in the MOS devices intermediate one of said reference voltage lines and said error node.

8. The self-biasing circuit of claim 1, in which said bias signal developing means includes means coupled to said threshold voltage sensing means for producing an intermediate signal having a parameter bearing a predetermined relation to the amplitude of said error signal, and means coupled to said intermediate signal producing means for producing said bias signal.

9. The self-biasing circuit of claim 8, in which said intermediate signal producing means comprises a variable-parameter oscillator.

10. The self-biasing circuit of claim 9, in which said parameter is amplitude.

* * * * *